United States Patent [19]
Dill et al.

[11] Patent Number: 5,496,455
[45] Date of Patent: Mar. 5, 1996

[54] SPUTTERING USING A PLASMA-SHAPING MAGNET RING

[75] Inventors: Michael Dill; Mark Mueller, both of San Jose, Calif.

[73] Assignee: Applied Material, Santa Clara, Calif.

[21] Appl. No.: 122,263

[22] Filed: Sep. 16, 1993

[51] Int. Cl.[6] .................................................. C23C 14/34
[52] U.S. Cl. ........................... 204/192.12; 204/298.16; 204/298.17; 204/298.19; 204/298.2; 204/298.22
[58] Field of Search ..................... 204/298.11, 298.14, 204/298.16, 298.17, 298.19, 298.21, 298.22, 298.18, 192.1, 192.12

[56] References Cited

U.S. PATENT DOCUMENTS

| | | | |
|---|---|---|---|
| 4,046,660 | 9/1977 | Fraser | 204/192.12 |
| 4,404,077 | 9/1983 | Fournier | 204/298.16 |
| 4,891,560 | 1/1990 | Okumura et al. | 204/298.19 |
| 5,022,978 | 6/1991 | Hensel et al. | |
| 5,085,755 | 2/1992 | Setoyama et al. | 204/298.16 |
| 5,182,001 | 1/1993 | Fritsche et al. | 204/298.2 |
| 5,277,778 | 1/1994 | Daube et al. | 204/298.16 |

FOREIGN PATENT DOCUMENTS

| | | | |
|---|---|---|---|
| 4018914 | 6/1991 | Germany. | |
| 57-207173 | 12/1982 | Japan | 204/298.16 |
| 62-77460 | 4/1987 | Japan | 204/298.18 |
| 2257987 | 1/1993 | United Kingdom. | |

*Primary Examiner*—R. Bruce Breneman
*Assistant Examiner*—Rodney G. McDonald
*Attorney, Agent, or Firm*—Allen N. Friedman

[57] ABSTRACT

Sputtering apparatus and method employing an auxiliary magnetic structure situated between the substrate holder and target of a plasma sputtering chamber to control the lateral extent of the plasma. The auxiliary magnetic structure, possessing a lower field strength in the plasma region than the principal magnet or magnets, is situated immediately outside of and around a circumference of the chamber's anode shield. The principal magnets maintain the plasma in a ring adjacent to the sputtering target. The auxiliary magnetic structure causes the plasma ring to expand toward the edge of the target or contract away from the edge depending on the magnetic strength and polarity of the structure and its position relative to the target.

4 Claims, 4 Drawing Sheets

SPUTTERING USING A PLASMA-SHAPING MAGNET RING

BACKGROUND OF THE INVENTION

1. Field of the Invention

Magnetron sputtering of material from a target onto a substrate.

2. Brief Description of the Prior Art

Sputtering is a thin film coating process using a plasma discharge in a sputtering gas to produce ion bombardment of a target of the material to be coated onto a substrate. Because of the ion bombardment, neutral atoms of the target material are ejected from the target surface toward the substrate and form a thin film coating. Magnetic fields have been used in sputtering devices for a variety of reasons. For example, U.S. Pat. No. 4,046,660, issued Sep. 6, 1977 discloses use of a magnetic field of a particular geometry to permit plasma operation at lower gas pressures, and magnetic control of the plasma to control the charged particle flux on the substrate. A class of sputtering devices has been developed that use an array of magnets to increase sputtering efficiency by confining the plasma to the vicinity of the target. The magnets are rotated concentrically with the target in an attempt to even out the erosion of the target. However, as sputtering progresses, a groove forms in the target and deepens, shortening target life, changing the distribution of sputtered material on the substrate, and permitting redeposition of target material as particulates on the target outside of the groove.

SUMMARY OF THE INVENTION

In the invention disclosed and claimed herein, the problems met in the prior art apparatus are alleviated by adjusting the lateral position of the plasma with respect to the target edge. Thus, for example, if a groove starts to form at one position in the target, the plasma position for subsequent sputtering operations can be changed. The disclosed sputtering apparatus and method employs an auxiliary magnetic structure situated between the substrate holder and the target of a plasma sputtering chamber, to control the lateral extent of the plasma. The auxiliary magnetic structure, possessing a lower field strength in the plasma region than the principal magnet or magnets, is situated immediately outside of and around the circumference of the chamber's anode shield. The principal magnets maintain the plasma in a ring adjacent to the sputtering target. The auxiliary magnetic structure causes the plasma ring to expand toward the edge of the target or contract away from the edge depending on the magnetic strength and polarity of the structure and its position relative to the target.

Adjusting the plasma position in this way will even out the utilization of the target material and extend target life. In addition, moving the plasma outward toward the target edge effectively increases the radius of the target and could permit sputtering onto larger wafers in the same deposition chamber. And if redeposition particulates form on the target the plasma can be moved to the position of the particulates to clean the target.

DETAILED DESCRIPTION OF THE INVENTION

In the widely known and commercially important sputtering coating process, a plasma is produced in a sputtering gas such as argon held at a reduce pressure. The plasma is formed adjacent to a target electrode formed of the material desired to be deposited on a substrate. Positive ions from the plasma bombard the target and dislarge neutral target atoms which travel through the plasma region and fall on the substrate to form the desired coating. During the coating process there is a gradual erosion of the target. As the target is used for successive depositions, there is a natural limit to its useful life due to this consumption of target material. The erosion of the target is greatest where the plasma is strongest because of the greater flux of positive ions impinging on the target surface.

Figure 1:
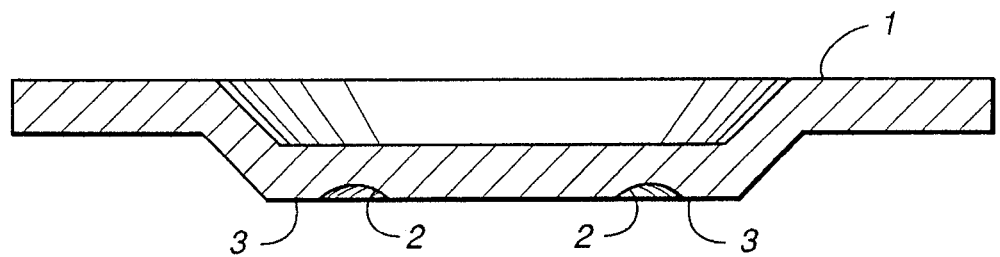
FIG. 1 is an upright view in cross section of a PRIOR ART apparatus, showing a typical position of an erosion groove.

In magnetron sputtering, magnetic fields partially confine the plasma to the region adjacent to the target. This type of apparatus is sometimes known as magnetron reactor. The magnetic fields are produced by magnets situated outside of the target. It is common to rotate the magnets about the axis of a cylindrically symmetric target in order to even out target erosion. It is also common to recess the outer surface of the target in order to place the magnets closer to the plasma area and gain greater control of the position of the plasma. FIG. 1 shows the effect in the PRIOR ART of the use of the same target 1 in successive sputter coating operations. Over time a circular groove 2 is formed in the surface of the target exposed to the plasma. The groove progressively deepens further confining the plasma and accentuating the deepening of the groove. This limits the target life, changes the angular distribution of the emitted neutral atoms and in many cases results in the redeposition of target material as particulates on the target 1 at a position 3 outside of the groove 2. The fact that the groove 2 is smaller in diameter than the portion of the target 1 within the sputtering chamber also limits the diameter of the substrate which can be coated with sufficient uniformity.

The problems indicated above are addressed in the invention through the use of an auxiliary magnetic structure. This auxiliary structure surrounds a planar region between the plane defined by the inner surface of the target and the plane defined by the substrate. The auxiliary magnet that produces a magnetic field in the plasma region that is no more than 50 percent of the field produced by the principal plasma containing magnets is used to vary the position of the plasma with respect to the target edge as is desired. If the field produced by the auxiliary magnetic structure is field-aiding with respect to the principal magnet field (i.e., the magnetic fields are substantially parallel), then the plasma is shifted toward the edge of the target. If the field produced by the auxiliary magnetic structure is field-opposed to the field produced by the principal magnet (i.e. the magnetic fields are substantially antiparallel), the plasma is shifted inward toward the center of the target. Changes in plasma position of more than one centimeter can be achieved through this mechanism. The amount of plasma position change depends upon the strength of the magnets used and the position of the auxiliary magnetic structure with respect to the target. While the use of an auxiliary magnetic structure that is magnetized radially with respect to the target is preferable, use of an axially magnetized magnetic structure may be desirable to produce a specific predetermined effect. A magnetic field used to confine the plasma to the region 9 of the apparatus adjacent to the inner surface 7 of the target 4 is produced by an array of magnets 14, producing a primarily radial field adjacent to its inner surface 7. It is common to attempt to even out erosion of the target surface 7 by rotating the magnets 14 about axis 15 as schematically indicated.

An auxiliary magnetic structure of the invention can be used to shift the position of the plasma from one deposition to the next in order to even out erosion of the target material or to clean the target of redeposited particulates. This cleaning process can be performed during deposition or as a separate cleaning step. One class of magnetic materials that has proven useful in devices of the invention are neodymium containing magnets. These magnets are known to have high coercivity and maintain their magnetization in magnet geometries that are short in the direction of magnetization with respect to the lateral extent of the magnet.

Figure 2:
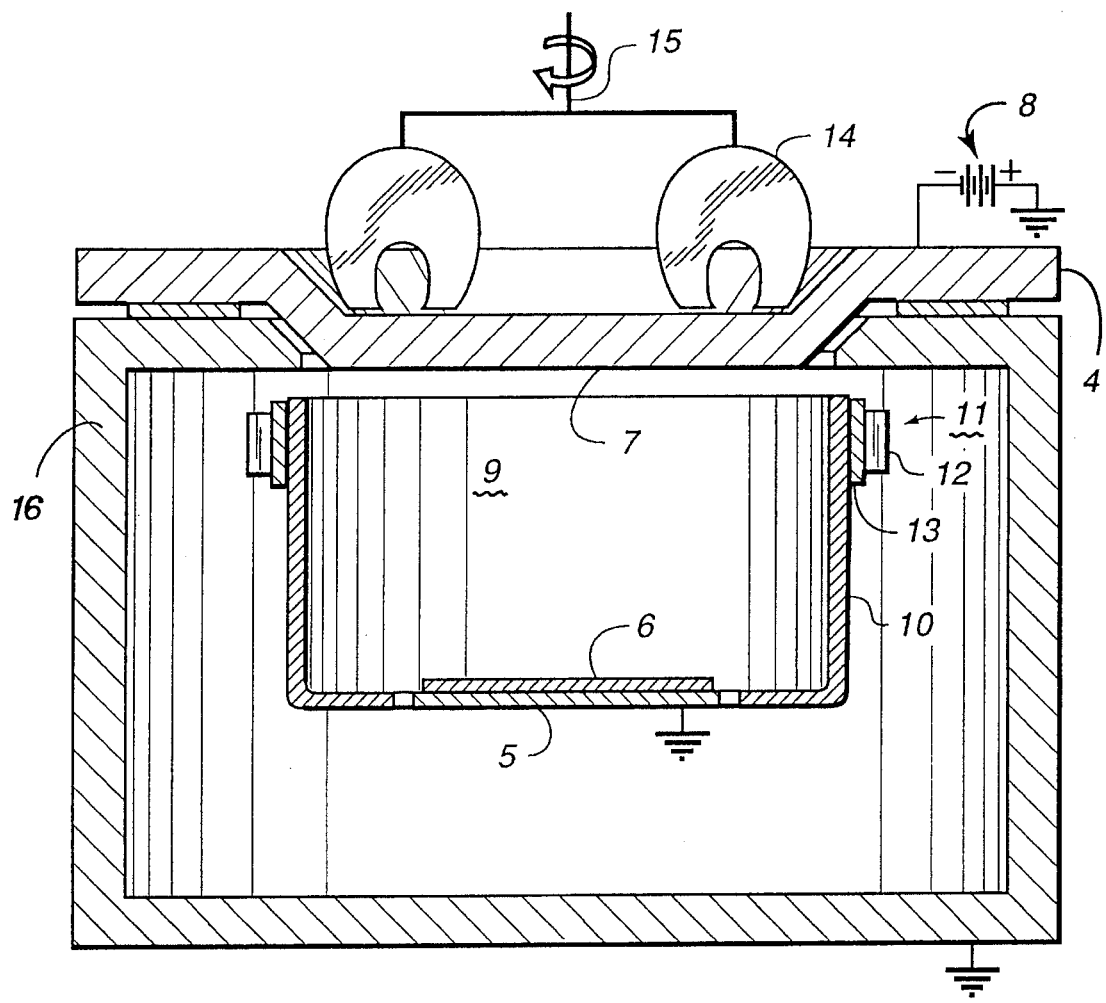
FIG. 2 is an upright view in cross section of a magnetron sputtering apparatus of the invention.

FIG. 2 shows an exemplary sputtering apparatus of the invention for sputtering material from a target 4 onto a substrate 6 supported by a substrate holder 5. The material is sputtered from the inner surface 7 of the target 4 when a plasma discharge is formed in the chamber 16, in the sputtering region 9. The substantial circular chamber 16 is depicted as a DC sputtering apparatus in which the plasma is formed in the chamber 16, which can be evacuated and filled with a low pressure processing gas by imposition of a negative DC bias from a power supply 8 to the target. The relationship between the required bias voltage and sputtering gas pressure within the sputtering region 9 is well known in the art. The apparatus also includes an anode shield 10 which serves to maintain the required electric field in the sputtering region 9 and the auxiliary magnetic structure 11 of the invention. The auxiliary magnetic structure 11 may be fixed to the anode shield 10 or movably engaging the anode shield 10. The auxiliary magnetic structure 11, for example, may consist of an array of permanent magnets 12 affixed to a band 13 of soft magnetic material. The magnets 12 need to be near the inner surface 7 of the target 4 so as to effectively interact with the principal magnets 14 in creating the confining magnetic field.

Figure 3:
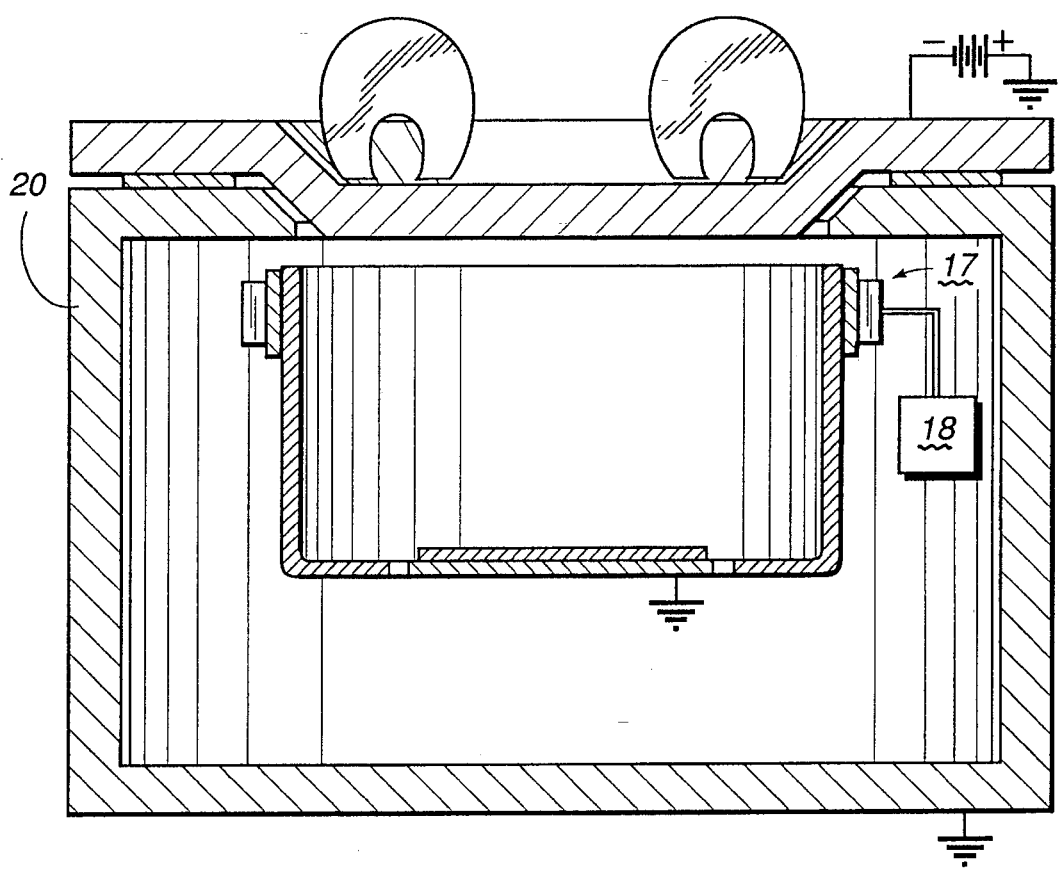
FIG. 3 is an upright view in cross section of a magnetron sputtering apparatus including means for axially translating the auxiliary magnetic structure.

FIG. 3 shows an exemplary apparatus of the invention in which the auxiliary magnetic structure 17 is affixed to a translating means 18, such as a rotatable threaded shaft, that is adapted for translating the magnetic structure 17 axially within the sputtering chamber 20.

Figure 4:
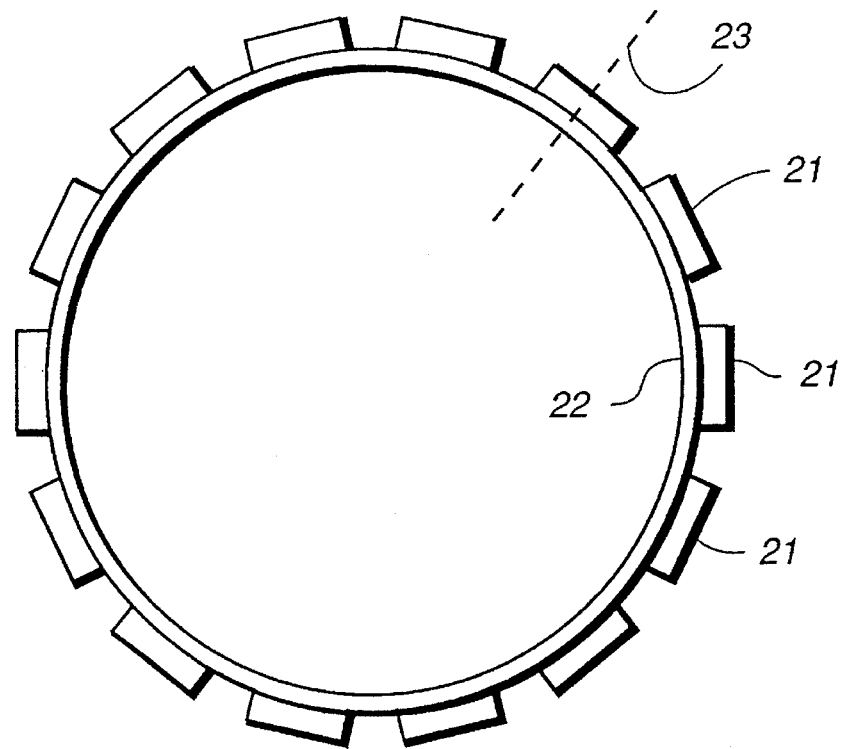
FIG. 4 is a top view of an exemplary auxiliary magnetic structure.

FIG. 4 shows a top view of an exemplary auxiliary magnetic structure including an array of permanent magnets 21 affixed to the surface of a band 22 of soft magnetic material. The magnets preferably are magnetized radially either all inward or all outward along a radial line 23. However, in order to produce some desired effect, as determined by calibration or calculation they may be magnetized axially which would be either into or out of the plane of FIG. 4. Although the described embodiments have all advantageously used permanent magnets, the invention could also use electromagnets.

Figure 5:
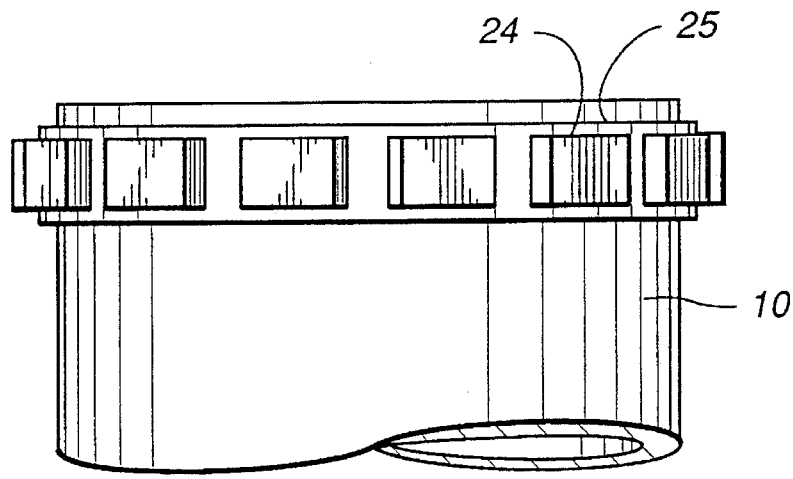
FIG. 5 is an upright view of an exemplary auxiliary magnetic structure surrounding an anode shield.

FIG. 5 shows a side view of an auxiliary magnetic structure of the invention showing permanent magnets 24 affixed to a band 25 of soft magnetic material. The structure surrounds the anode shield 10.

Figure 6:
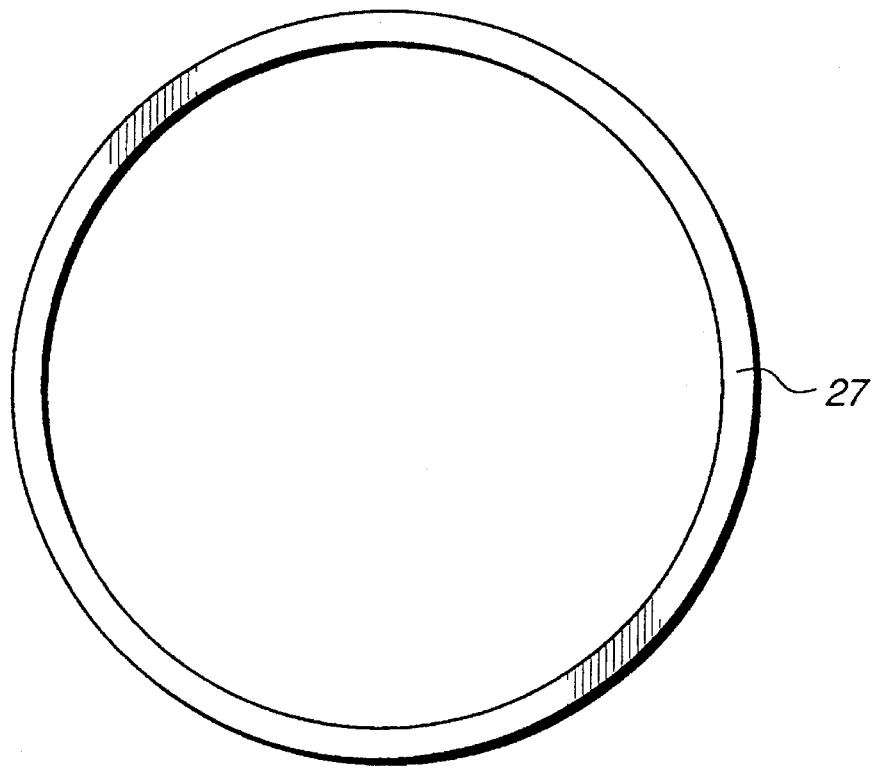
FIG. 6 is a top view of an exemplary auxiliary magnetic structure.

FIG. 6 depicts the auxiliary magnetic structure as being a solid ring 27 of permanent magnetic material, which as before, is preferably magnetized radially. However, possibly magnetized axially, perpendicular to the plane of FIG. 6.

Figure 7:
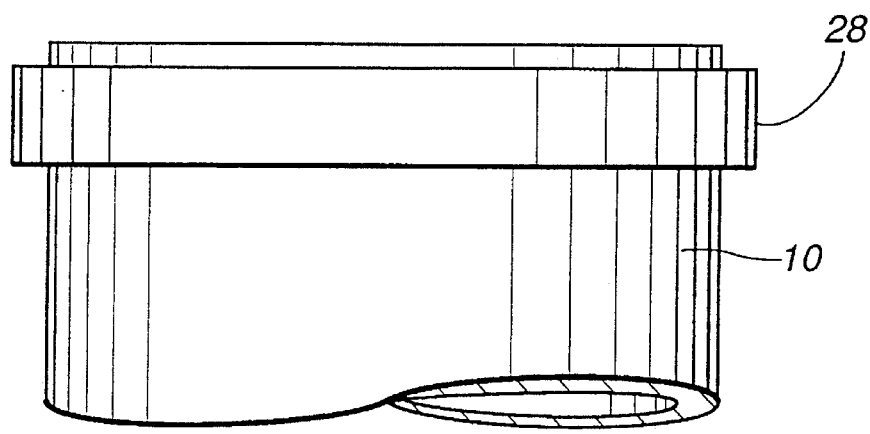
FIG. 7 is an upright view of an exemplary auxiliary magnetic structure surrounding an anode shield.

FIG. 7 shows a solid ring of permanent magnet material 28 surrounding the anode shield 10.

What is claimed is:

1. A magnetron plasma sputter deposition apparatus comprising an evacuable chamber, a substrate holder within the chamber for supporting the substrate and defining a substrate plane, a target electrode for supplying a deposition material and having an inner surface defining a target plane, a principal magnetic structure adjacent to an outer surface of the target electrode for producing a magnetic field within the chamber so as to confine a plasma adjacent to the inner surface of the target electrode, and an auxiliary magnetic structure situated between the target plane and the substrate plane and surrounding a planar region disposed between the target electrode and the substrate holder, and further includes a translating means for moving the auxiliary magnetic structure axially in the sputtering chamber.

2. A method of sputter coating a thin film of material from a target onto a substrate comprising, electrically biasing the target with respect to the substrate sufficient to produce a plasma discharge, confining the plasma adjacent to the target by means of magnetic fields from a principal magnetic structure adjacent to the outer surface of the target, and further applying an auxiliary magnetic field from a structure surrounding a planar region between the target and the substrate and situated between the planes of the target and the substrate, and axially moving the auxiliary magnetic structure from a first axial position to a second axial position, whereby the plasma is moved to a second radial position.

3. A magnetron plasma sputter deposition apparatus comprising an evacuable chamber, a substrate holder within the chamber for supporting the substrate and defining a substrate plane, a target electrode for supplying a deposition material and having an inner surface defining a target plane, a principal magnetic structure adjacent to an outer surface of the target so as to confine a plasma adjacent to the inner surface of the target electrode, wherein, the apparatus also includes an auxiliary magnetic structure situated between the target plane and the substrate plane and outside of the plasma region disposed between the target electrode and the substrate holder, the auxiliary magnetic structure comprising a circular band of soft magnetic material and an array of permanent magnets affixed thereto and radially magnetized with respect to the sputtering chamber, all inward along a radial line.

4. A magnetron plasma sputter deposition apparatus comprising an evacuable chamber, a substrate holder within the chamber for supporting the substrate and defining a substrate plane, a target electrode for supplying a deposition material and having an inner surface defining a target plane, a principal magnetic structure adjacent to an outer surface of the target so as to confine a plasma adjacent to the inner surface of the target electrode, wherein, the apparatus also includes an auxiliary magnetic structure situated between the target plane and the substrate plane and outside of the plasma region disposed between the target electrode and the substrate holder, the auxiliary magnetic structure comprising a circular band of soft magnetic material and an array of permanent magnets affixed thereto and radially magnetized with respect to the sputtering chamber, all outward along a radial line.

* * * * *